United States Patent

[11] 3,581,305

[72] Inventor Donald L. Howlett
Houston, Tex.

[21] Appl. No. 745,642
[22] Filed July 17, 1968
[45] Patented May 25, 1971

[73] Assignee Texaco Inc.
New York, N.Y.

[54] SEQUENTIAL APPROXIMATION PULSE HEIGHT ANALOG-TO-DIGITAL CONVERTER
5 Claims, 3 Drawing Figs.

[52] U.S. Cl. .......... 340/347
[51] Int. Cl. .......... H03k 13/14
[50] Field of Search .......... 340/347; 235/92

[56] References Cited

UNITED STATES PATENTS

| | | | |
|---|---|---|---|
| 2,866,599 | 12/1958 | Hutchinson | 235/92 |
| 3,059,228 | 10/1962 | Beck et al. | 340/347X |
| 3,432,687 | 3/1969 | Emmer | 340/347X |
| 3,469,256 | 9/1969 | Runge | 340/347 |

*Primary Examiner*—Maynard R. Wilbur
*Assistant Examiner*—Michael K. Wolensky
*Attorneys*—K. E. Kavanagh, Thomas H. Whaley and Robert J. Saunders, Jr.

ABSTRACT: A sequential approximation pulse height analog-to-digital converter including a sample and hold circuit. The converter, including the sample and hold circuit, substantially reduces the "dead time" heretofore required to discharge or step down a capacitor retaining a peak voltage value.

SEQUENTIAL APPROXIMATION PULSE HEIGHT ANALOG-TO-DIGITAL CONVERTER

BACKGROUND OF THE INVENTION

This invention pertains, in general, to analog-to-digital converters; and, more particularly, to sequential approximation pulse height analog-to-digital converters suitable for use with high speed random pulses.

A number of pulse eight converters are commercially available for use in analyzing nuclear events. For the most part such devices employ a ramp type converter which stores a charge on a capacitor and discharges the capacitor stepwise. The required number of steps is a measure of the amplitude of the input pulse. A major disadvantage of this type of converter is the time required to step down the voltage on the capacitor. During this process no new data can be accepted. This interval of time, during which the voltage on the capacitor is being stepped down, is referred to as "dead time" and creates difficulties in the analysis of data. It is highly desirable that this so-called "dead time" be held to minimum.

SUMMARY OF THE INVENTION

One object of the present invention is to provide a pulse height analog-to-digital converter in which the "dead time" is substantially reduced.

Another object of the invention is to provide a sequential approximation type of analog-to-digital (A–D) converter in which the so-called "dead time" is reduced.

Another object of the invention is to provide a sequential approximation A–D converter which is especially useful with high speed random pulses.

Other objects and advantages as well as the various features of novelty which characterize the invention are pointed out with particularity in the claims annexed herewith and forming part of he specification. For a clearer understanding of the invention, its operating advantages and the specific objects obtained by its use reference is to be made to the accompanying drawing FIGS. and the descriptive matter in which there is illustrated and described an illustrative embodiment of the invention.

DETAILED DESCRIPTION OF THE INVENTION

Figure 1:
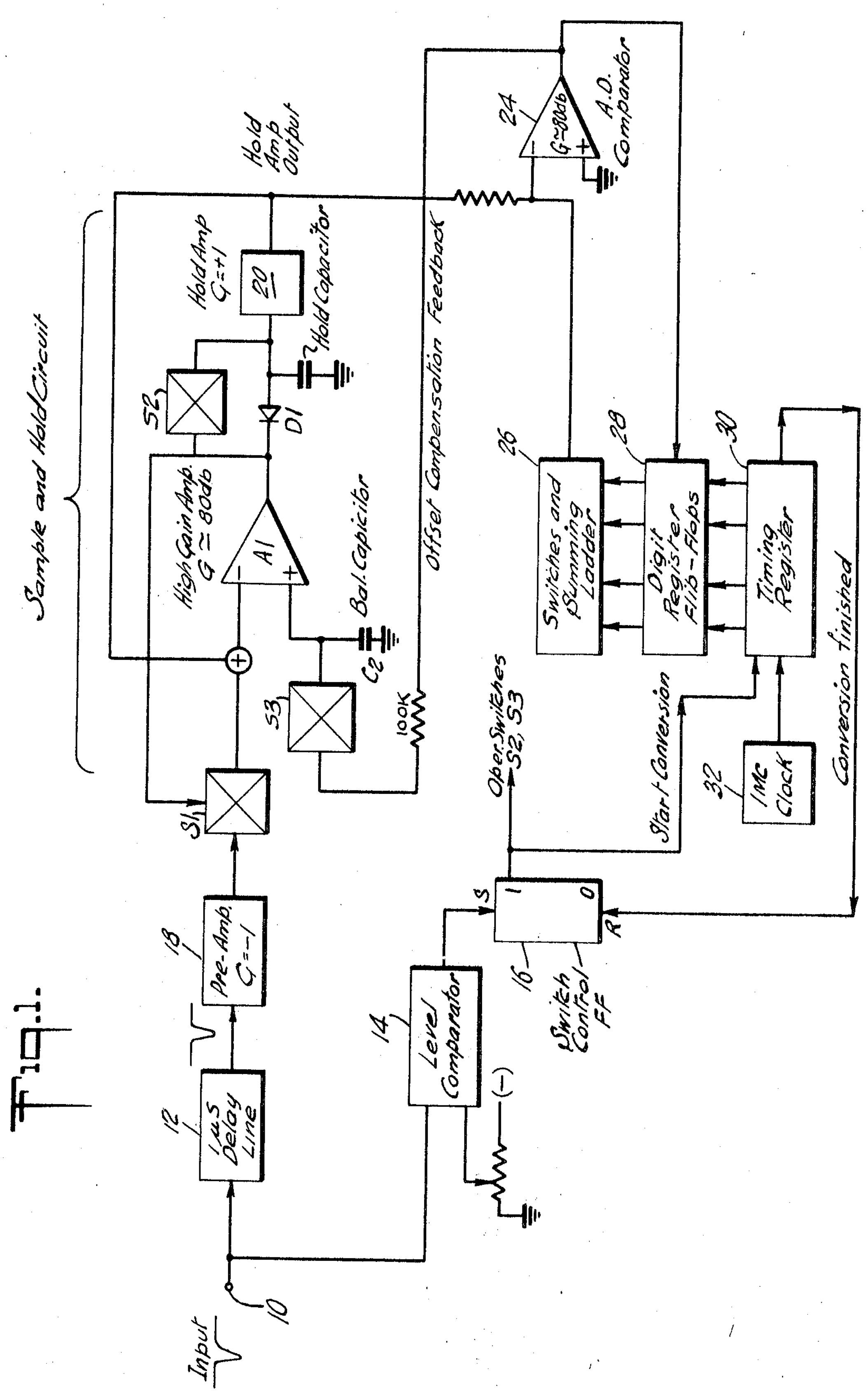
FIG. 1 is a block diagram showing the overall operation of the sequential approximation analog-to-digital converter in accordance with the invention.

In FIG. 1 there is shown a block diagram of the converter in accordance with an illustrative embodiment of the invention. The block diagram of FIG. 1 is useful in understanding the overall operation of the subject converter.

As shown in FIG. 1, the converter is provided with an input terminal 10. In parallel therewith is a delay line 12 and a level comparator 14. In the illustration shown, delay line 12 may, for example, be a 1 microsecond delay line. Coupled to the output of level comparator 14, is a switch control flip-flop 16. Coupled to the output of delay line 12 is a preamplifier or preamp 18. In the illustration shown in FIG. 1, preamp 18 has a gain or amplification factor of G =−1.

The output signal from a preamp 18 is delivered to a SAMPLE AND HOLD CIRCUIT, as labeled in the diagram of FIG. 1. This SAMPLE AND HOLD CIRCUIT is comprised of switches S1, S2 and S3, operational amplifier A1, a hold amplifier 20, Diode D1, a hold capacitor and the balance capacitor C2. More detail on the aforementioned SAMPLE AND HOLD CIRCUIT and the various elements comprising it are discussed in detail hereinafter.

The subject converter circuit is further comprised of the analog-to-digital comparator 24, the switches and summing ladder unit 26, the digit register flip-flop unit 28, timing register 30 and the clock 32.

With reference to FIG. 1, the overall operation of the subject converter circuit is as follows:

A negative going input pulse signal is delivered to the input terminal 10 of the subject converter. This input pulse signal is compared with a predetermined DC level so that signals below a predetermined interest level are ignored. Thus, only those signal pulses having amplitudes greater than the discriminator level will succeed in triggering the level comparator unit 14. When an input pulse having sufficient amplitude is delivered to the input terminal 10 and to level comparator 14, the level comparator 14 sets the switch control flip-flop 16. This action causes the switches S2 and S3 in the SAMPLE AND HOLD CIRCUIT to open; thereby enabling a sampling operation. At the same time the negative going input pulse is simultaneously routed through the delay line 12 to allow operation of the aforementioned switches before the input pulse arrives at the input terminal of the preamp 18. Preamp 18 provides impedance matching as well as gain calibration. Furthermore, the switch S1 following preamp 18 is in the practical circuit incorporated with preamp 18. But, for purposes of the present discussion switch S1 will be considered as if it is a separate unit for purposes of explanation. Preamp 18 is an inverting amplifier. Therefore its output pulse will be a positive going pulse. As shown, the output from preamp 18 is connected to the input of the SAMPLE AND HOLD CIRCUIT through switch S1. Switch S1 is still closed at this time.

In the SAMPLE AND HOLD CIRCUIT, a high-gain amplifier A1, diode D1 and the hold amplifier 20 in effect form an operational amplifier having a gain of −1 for positive going pulses. This operational amplifier circuit will not follow negative transitions with switch S2 open. As the input pulse rises to its peak value, the output of the hold amplifier 20 follows with a gain of −1 which is exact within the limits set by operational amplifier theory. All nonlinearities created by Diode D1 are reduced by the gain of the amplifier A1, which is about 80 db. As soon as the input pulse reaches its peak value and starts to fall off, Diode D1 ceases to conduct and the hold amplifier 20 and hold capacitor C2 are effectively disconnected from amplifier A1. The voltage across capacitor 22 remains at the peak value of the pulse. As a result, the output of hold amplifier 20 stays at the peak amplitude of the pulse. The hold amplifier 20 has a very high input impedance and Diode D1 has a very low leakage so that the discharge time constant of capacitor 22 is of the order of several seconds. Since it is only necessary to hold the charge on capacitor 22 for a few microseconds, the output of hold amplifier 20 may be considered to be constant.

From this point onward, the analog-to-digital conversion is accomplished in the conventional sequential approximation mode. The output of hold amplifier 20 is delivered to the A–D comparator 24 where it is compared with a voltage from summing ladder 26. Each input to summing ladder 26 is controlled by the state of a corresponding digit register flip-flop 28. When the particular flip-flop is in the "1" state, the summing ladder input is connected to the positive precision reference voltage, Vref. However, when the particular flip-flop is in the "O" state, the input is connected to ground. Summing ladder 26 is constructed in binary form so that the first input creates an output voltage of Vref/2, the next input creates an output voltage of Vref/4, and so forth to the last input.

The digit register 28 starts off with the most significant flip-flop in the "1" state. After a 1 microsecond delay, the A–D comparator 24 has had enough time to decide if the output from the summing ladder 26 is greater than or less than the output of the hold amplifier 20. The flip-flop will then be reset if the ladder voltage is greater. Each flip-flop is tried in sequence until the conversion is complete. When complete, the digit register 28 contains the binary number representing the amplitude of the input pulse. This number is then read out to a digital recording system (not shown) and the digit register 28 is reset to "0." At the end of the conversion, primary register 30 will reset the switch control flip-flop 16 and turn on switches S2 and S3. Switch S2 will complete the path to make the hold amplifier 20 function as an operational amplifier again and the hold capacitor 22 will be discharged very rapidly. The digit switches are reset so that the output of the summing ladder 26 becomes O volts. If any DC offset error voltages exist anywhere in the system, the output of the A–D comparator 24 will also be a O volts. The output of the comparator 24 will be the accumulated error voltage multiplied by the gain of the comparator which, in the case shown, is 80 db. The output of comparator 24 is fed back through the offset compensation feedback loop to switch S3 as well as to the balance capacitor C2. Then the voltage on capacitor C2 is modified to drive the output of comparator 24 towards 0 volts. Hence, compensation is made for any offset voltages that may exist. This compensation is performed continuously except during the short interval of the conversion.

Switch S1 is controlled from the output of the high gain amplifier 18. When the input pulse reaches its peak value, the output of the high gain amplifier A1 swings positive very rapidly. As the output crosses O, switch S1 is turned off or is opened. This prevents the occurrence of another input pulse from disrupting the SAMPLE AND HOLD CIRCUIT functioning during the conversion. Hence, this will result in a dead time of about 10 microseconds or whatever time is required to complete the conversion. If very high pulse rates are expected, it is possible to use two or more sample and hold circuits as shown alternately, such that while one is used, the other is free to accept new data pulses.

Figure 2:
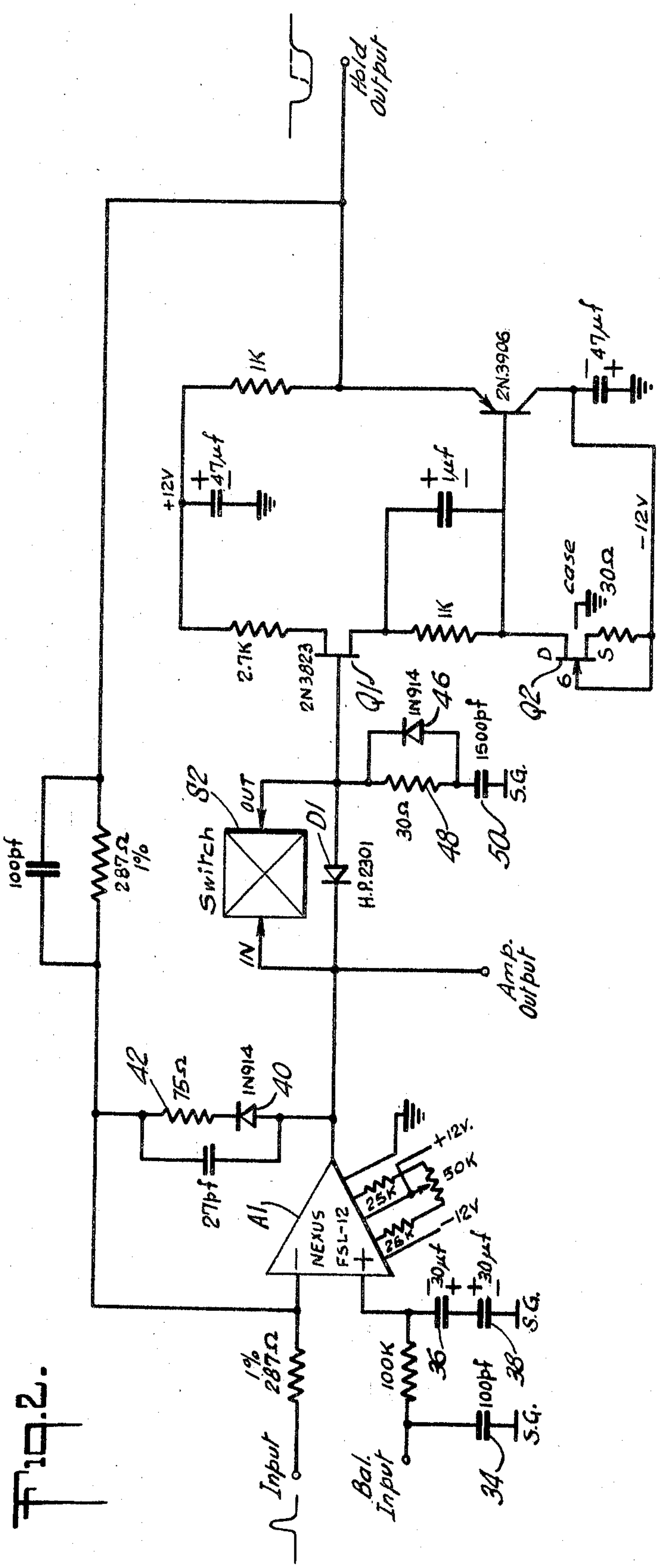
FIG. 2 is a schematic diagram showing a sample and hold circuit which is included in the block diagram shown in FIG. 1 of the subject converter.

In FIG. 2 the SAMPLE AND HOLD CIRCUIT referred to in FIG. 1 is shown in more detail. As shown amplifier A1 is provided with a negative input terminal and a positive input terminal in FIG. 2. As shown, there is associated with the positive input of amplifier A1 in FIG. 2 a balance input network which is the equivalent of the balance capacitor C2 except that in FIG. 2, three capacitors 34, 36 and 38 are employed together with an input resistor; the capacitors being connected to a signal ground (SG). As shown in FIG. 2, the output from amplifier A1 is coupled back to the negative input terminal thereof by means of a circuit including a diode 40, series resistor 42 and capacitor 44. Also, in the output circuit of the amplifier A1, there is included the diode D1 which, as shown, is shunted by the switch S2. The details of switch S2 are set forth schematically in FIG. 3. As shown, there is associated with the diode D1 and switch S2 another circuit comprising the diode 46, resistor 48 and capacitor 50; capacitor 50 being connected to signal ground (SG) as shown. Connected with the output terminal of switch S2 and the diode D1 is the hold amplifier 20 (FIG. 1) which, as shown in FIG. 2, is comprised of the two field effect transistors Q1 and Q2 and the NPN transistor Q3. The output of the hold amplifier 20 is, as shown, taken from the emitter electrode of transistor Q3.

Figure 3:
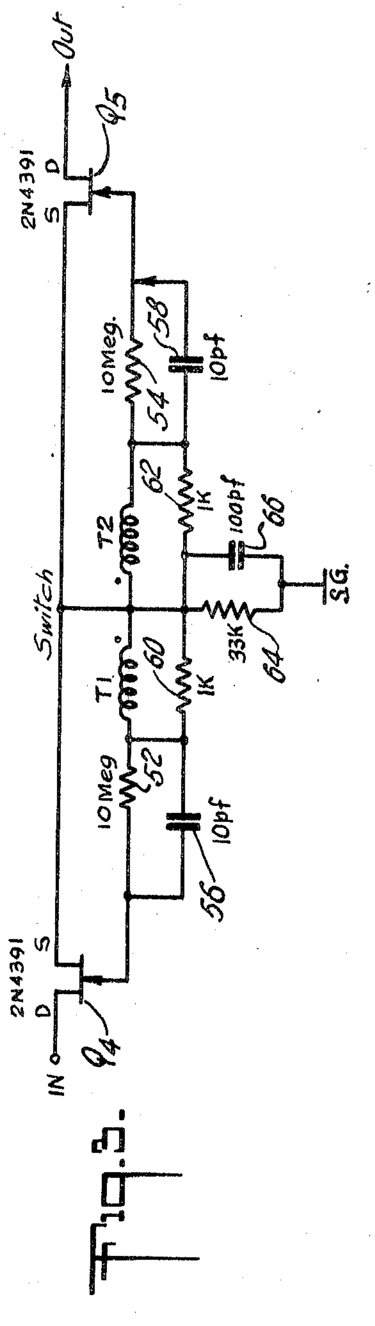
FIG. 3 is a schematic diagram of a typical switch employed in FIGS. 1 and 2.

In FIG. 3, a schematic diagram of the various elements and connections forming the switch S2 is shown. Switches S1 and S3 are similarly constructed. As shown in FIG. 3, the switch S2 is comprised of the two field effect transistors Q4 and Q5. Transistors Q4 and Q5 are arranged at the input and output terminals of the switch, respectively. The two source electrodes of transistors Q4 and Q5 are serially coupled as shown and between the emitter electrodes of transistors Q4 and Q5 there is located symmetrically the coils T1 and T2 and the resistors 52 and 54. Capacitors 56 and 58 are connected and shunted by the resistors 52 and 54, respectively. Similarly, the two coils T1 and T2 are shunted by the resistors 60 and 62, respectively. The two coils T1 and T2 have the common ends thereof connected to the signal ground through a resistor 64. Resistor 64 is, as shown, connected in parallel with signal ground (SG) by the capacitor 66.

Although specific values of various circuit elements are pointed out with specificity in FIG. 2 and FIG. 3, it is to be understood that this is done for purposes of illustration only and that such specificity is not intended to be limitive of the inventive concept involved.

While one more or less specific embodiment of the invention has been shown, it is to be understood that the principles of the invention may be otherwise embodied without departing from the spirit and scope of the invention and that the invention is to be interpreted in light of the claims annexed hereto.

What I claim is:

1. A sequential approximation pulse height analog-to-digital converter comprising: delay line means having input and output terminals; level comparator means having input and output terminals, the input terminals of said delay line means and said level comparator means being commonly connected thereby providing input means for applying an analog signal preamplifier means having input and output terminal means, said input terminal means of said preamplifier means being connected to said output terminal means of said delay line means; flip-flop means having set, reset and output terminal means, said set terminal means being connected to said output terminal means of said level comparator means; sample and hold circuit means having input and output terminal means, said output terminal means of said flip-flop means being coupled to an input of said sample and hold circuit means; analog-to-digital comparator means having input and output terminal means, said input terminal means of said analog-to-digital comparator means being coupled to said output terminal means of said sample and hold circuit means; timing register means having input and output terminal means, said output terminal means of said timing register means being connected to said reset terminal means of said flip-flop means and said output terminal means of said flip-flop means being also connected to said input terminal means of said timing register means; clock means coupled to said input terminal means of said timing register means; digit register flip-flop means having input and output terminal means, said output terminal means of said timing register means being coupled to said input terminal means of said digit register flip-flop means and said output terminal means of said analog-to-digital comparator means being coupled to said input terminal means of said digit register flip-flop means; and, switches and summing ladder means said digit register means comprising means for providing a digital output signal corresponding to the applied analog signal having input and output terminal means, said input terminal means of said switches and summing ladder means being coupled to said output terminal means of said digit register flip-flop means and said output terminal means of said switches and summing ladder means being coupled to said input terminal means of said analog-to-digital comparator means.

2. The converter according to claim 1 wherein said sample and hold circuit means is comprised of first switch means having input and output terminal means, said input terminal means of said first switch means being coupled to said output terminal means of said preamplifier means; first amplifier means having negative and positive input terminal means an output terminal means, said negative input terminal means being coupled to said output terminal means of said first switch means; second amplifier means having input and output terminal means; diode means connected in series between said output and input terminal means of said first and second amplifier means, respectively, said output terminal means of said second amplifier means being coupled to said input terminal means of said analog-to-digital comparator means; second switch means having input and output terminal means in parallel with said diode means; hold capacitor means coupled to said input terminal means of said second amplifier means; third switch means having input and output terminal means, said output terminal means of said third switch means being coupled to said positive input terminal means of said first amplifier means; balance capacitor means coupled to said positive input terminal means of said first amplifier means;

and, impedance means coupled between said output terminal means of said analog-to-digital comparator means and said input terminal means of said third switch means.

3. The converter according to claim 2 further comprising additional circuit means coupling said output terminal means of said second switch means to said input terminal means of said first switch means.

4. The converter according to claim 2 further comprising circuit means for coupling said output terminal means of said flip-flop to the input terminal means of said second and third switch means.

5. The converter according to claim 2 wherein said hold capacitor means is connected between said input terminal means of said second amplifier means and ground potential.